United States Patent [19]

Geesen et al.

[11] Patent Number: 4,479,249
[45] Date of Patent: Oct. 23, 1984

[54] APPARATUS FOR COLLECTING AND PROCESSING MESSAGES TRANSMITTED AT DIFFERENT SIGNAL FREQUENCIES

[75] Inventors: Michel Geesen, Antony; Jacques Mourant, Maurepas; Daniel P. Ludwig, Ramonville-Saint-Agne, all of France

[73] Assignees: Electronique Marcel Dassault; Centre National d'Etudes Spatiales, both of Paris, France

[21] Appl. No.: 318,548

[22] Filed: Nov. 5, 1981

Related U.S. Application Data

[63] Continuation-in-part of Ser. No. 38,748, May 14, 1979, abandoned, Ser. No. 166,621, Jul. 7, 1980, Pat. No. 4,398,286, which is a continuation-in-part of Ser. No. 38,770, May 14, 1979, abandoned.

[30] Foreign Application Priority Data

May 16, 1978 [FR] France .................... 78 14339
May 17, 1978 [FR] France .................... 78 14626

[51] Int. Cl.³ ............................................ H04B 1/16
[52] U.S. Cl. .................................. 455/208; 329/122; 455/226; 455/260

[58] Field of Search ............... 455/206, 208, 209, 214, 455/226, 260, 265, 161, 165, 42; 329/122

[56] References Cited

U.S. PATENT DOCUMENTS 3,614,627 10/1971 Runyan et al. .................. 455/208

Primary Examiner—Marc E. Bookbinder
Attorney, Agent, or Firm—Pollock, Vande Sande & Priddy

[57] ABSTRACT

An apparatus for receiving messages transmitted from a plurality of radio signal sources operating at different frequencies within a predetermined frequency band. Means are provided to frequency scan the receive signals, deriving information for determining the frequency range in which said signals lie. A demodulating phase locked loop is connected to receive the radio frequency signals, and an initial operating frequency for the phase locked loop is provided by the frequency range information determined from the means for frequency scanning. A resetting circuit is included to maintain the phase locked loop oscillator frequency at a value independent of the frequency of the radio signals.

15 Claims, 7 Drawing Figures

APPARATUS FOR COLLECTING AND PROCESSING MESSAGES TRANSMITTED AT DIFFERENT SIGNAL FREQUENCIES

This application is a continuation-in-part of application Ser. No. 038,748, filed May 14, 1979 now abandoned; Ser. No. 166,621, filed July 7, 1980 now U.S. Pat. No. 4,398,286, which is a continuation-in-part of Ser. No. 038,770; filed May 14, 1979, now abandoned.

FIELD OF THE INVENTION

The invention relates to apparatus adapted for received messages received at different frequencies for example from a plurality of stations and for processing these messages with a view to extracting the information they contain.

Such apparatus may have use in a transmission installation which comprises a plurality of beacons distributed in a territory and transmitting messages in digital language by phase modulation of a carrier wave, these messages being adapted to be collected by an apparatus carried by a satellite moving above the territory either for storing the received signals in a memory or for retransmitting the same.

The messages transmitted by the various beacons reach the satellite in a random or asynchroneous manner and the frequency of their carrier waves (which is typically in the order of several MHz) is unknown so that the apparatus comprises frequency analysis means for scanning a predetermined frequency band inside which it is known that the transmitted carrier wave frequencies are contained, and at least one processing device having a phase locked loop for performing the demodulation of the message or messages selected in the course of the spectrum analysis.

SUMMARY OF THE INVENTION

The present invention relates to improvements in such an apparatus which permit a simple and economical construction with high efficiency to be attained.

According to one object thereof, the invention relates to apparatus calling upon a phase locked loop notably for the demodulation of phase modulated signals and it applies, in particular, to the demodulation of messages which may have frequencies within the input frequency band which may be located in the MHz or tens of MHz range, or higher.

Apparatus is provided which comprises at least one phase locked loop for processing a message which is condition operable condition after determining an range of the frequency of a pure carrier wave preceding the modulated part of the message.

A good frequency locking condition of the loop, both in its preliminary condition, where it is tuned to the carrier frequency of the modulation, and in its condition where it participates in the demodulation, may be achieved, taking into account the frequency band allotted for gathering the data, by using for such a phase locked loop high frequency stability components, typically piezoelectric, as oscillators and/or filters.

Under these conditions, an information or data gathering phase locked loop works in a frequency range wherein these piezoelectric components are operable, that is to say, a high frequency range.

Such a data gathering phase locked loop may thus be relatively expensive by reason of the fact that it comprises piezoelectric components.

According to one aspect thereof, the present invention demonstrates that good absolute frequency stability may be obtained as with relatively low frequency stability components if these components work in a low frequency range.

Accordingly, in a data gathering phase locked loop which is frequency prepositioned by an frequency range determination, a non-piezoelectric oscillator and a band pass filter, also non-piezoelectric are used, the frequency of the signals applied to the phase locked loop being lowered with respect to that of the signals received, by a frequency divider to a range of frequencies in the order of some ten or some hundred kHz.

Equivalent results may be obtained as with the use of piezoelectric components.

This aspect of the invention is particularly advantageous in case the apparatus of which the phase locked loop or loops are a part comprises an ultrastable oscillator as it provides using said ultrastable oscillator with components having relatively low frequency stability to the condition in which they remain operable in the phase locked loop.

BRIEF DESCRIPTION OF THE DRAWINGS

In the description which follows, given by way of example, the accompanying drawings are referred to, in which.

DESCRIPTION OF EMBODIMENTS

Figure 1:
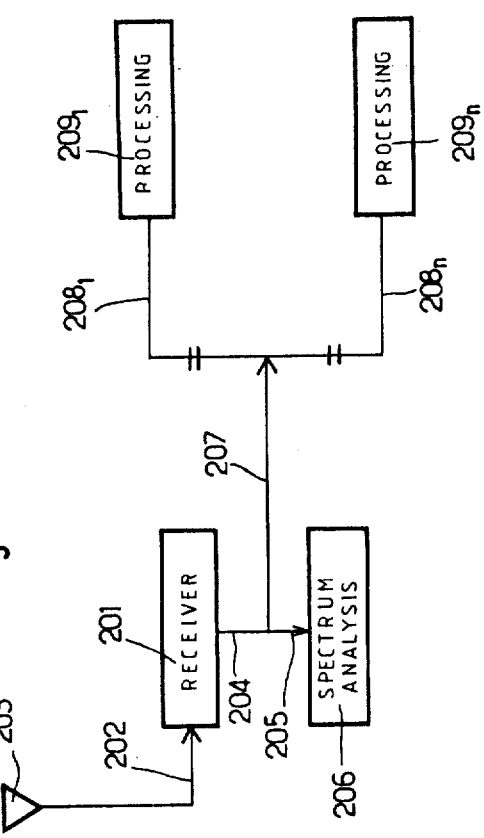
FIG. 1 is a circuit block diagram of apparatus for receiving and processing radio signals received from a plurality of stations.

A radio receiver 201 (FIG. 1), intended to furnish signals to a spectrum analyzer and processing devices, has an input 202 to which are applied signals picked up by an antenna 203. Its output 204 is divided into two branches, one 205 which constitutes the input of a device 206 for measuring the level and frequency of signals received and the other 207 starting from which are branched parallel path $208_1 \ldots 208_n$ ending at processing devices $209_1 \ldots 209_n$ for demodulating the received signals.

Figure 2:
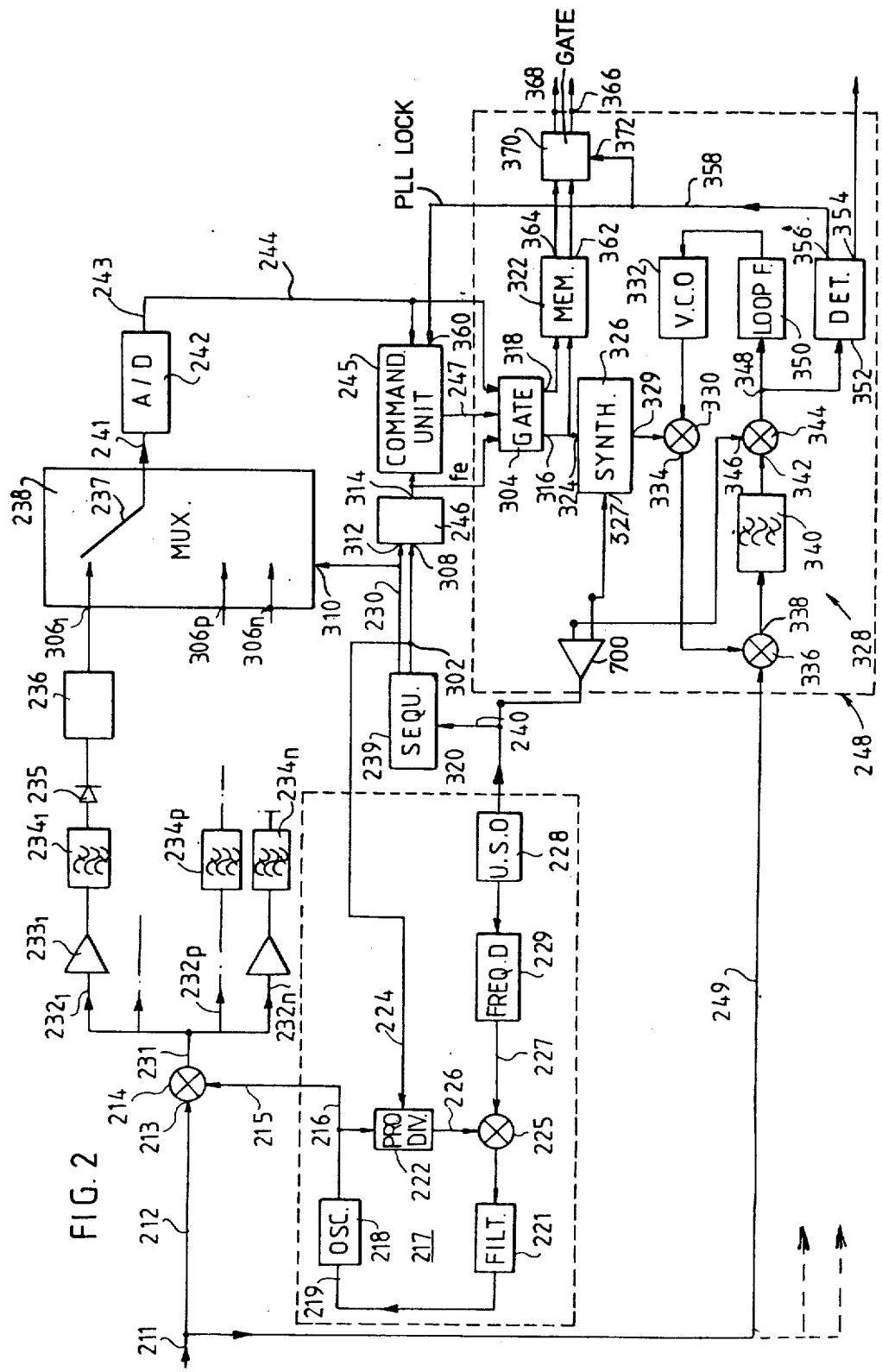
FIG. 2 is a block diagram of a portion of a circuit such as that of FIG. 1 for analyzing the frequency of the received signal.

Reference is now made to FIG. 2. The signals coming from a radio receiver, such as 201, reach input 211 which is applied by a line 212 to the input 213 of a mixer 214. The second input 215 of this mixer is connected by a line 216 to the output of oscillator 218 in a phase locked loop 217 comprising oscillator 218, the frequency of which is controlled by voltage applied by a phase comparator 225 to its input 219, via a band pass filter 221, and a frequency divider 222 programmable by narrow increments under the action of a programming control line 224. The loop 217 also comprises the phase comparator 225 whose input 226 coupled to the output of programmable divider 222, is part of the loop and whose other input 227 applies to the phase comparator 225 an ultrastable frequency furnished by an ultrastable oscillator 228 via a frequency divider 229 introducing a fixed division factor.

The fast repetitive frequency scanning of the VCO 218 output is controlled by the programmable divider 222 whose programming input is cycled step by step over a predetermined range of digital values.

Because of the closed loop control afforded by phase locked loop 217, the value of the frequency applied to the input 215 of the mixer 214 does not depend on the conditions of aging of the VCO 218, and the accuracy is that of the ultrastable oscillator 228.

The output 231 of the mixer 214 may be divided into a number of band pass filtering paths or channels $232_1 \ldots 232_n$ in each of which an amplifier 233 feeds a band pass filter 234, the number of paths, and therefore the number of filters, depending on the width of the frequency band scanned by the synthesizer compared with the entire width of the spectrum to be scanned at the output of receiver 201.

The output of each filter 234 is coupled via a detector 235 to a filter 236 the output of which is connected to a respective sample input $306_p$ of a multiplexer 238 (switch 237) controlled by a line 230 out of a sequencer or timing circuit 239 connected by a line 240 to the ultrastable oscillator 228. The line 241 connected at the output of multiplexer 238 forms the input of an analog/digital converter 242 whose output 243 is applied by a line 244 to a command unit 245 also connected to the sequencer 239 via a frequency evaluation circuit 246.

At the output 247 of the command unit 245 are present in succession couples of values of level N and frequency F which constitute the information sought by scanning the spectrum.

This information may be used for adjusting at any moment the frequency of a processing device 248 for demodulating a signal among signals which may be present on input 211 which are routed by a line 249 to this processing device 248.

It has been established that instead of using a VCXO type piezo-electric oscillator requiring a command coming from a digital/analog converter and being part of an open loop as a frequency scanning oscillator, a frequency synthesizer may be employed, including a closed loop comprising a VCO type oscillator, that is to say, non-piezo-electric, as has just been described with which, all things being equal, the scanning speed may be considerably increased in a ratio ranging from 1 to 4.

It is also possible to assure the scanning of a wider range of frequencies by calling upon a frequency synthesizer and not an open-loop local oscillator.

Preferably, signals received from the beacons each include a pure carrier wave portion which is unmodulated and is followed by a modulated, typically phase modulated, portion containing the particular message or data to be collected by the satellite from the respective beacon.

In operation, (FIG. 2), the synthesizer 217 is controlled by the programming input 224 of its programmable divider 222, so as to sweep a frequency band $\Delta f_m$. Thus, $\Delta f_m$ is the frequency excursion of the local oscillator signal on input 215 of mixer 214.

The programming input 224 is controlled via output 302 of sequencer 239. This output 302 is progressively and repeatedly incremented step by step over a given range of control values so as to produce a digital control signal for programmable divider, each step corresponding for example to 100 Hz on input 215 at the output of the synthesizer 217. If, for example, the output is 320 cycles over 256 steps, the corresponding frequency excursion of signals on input 215 will be 25 kHz.

The output signal of the mixer 214 has a frequency corresponding to the difference between any frequency signal at the input 211 of the circuit of FIG. 2 (i.e. corresponding to output 204 of a receiver 201 of FIG. 1) and that of input 215.

This differential frequency on output 231 of mixer 214 is simultaneously applied to the n filtering channels $232_1$ to $232_n$.

The center frequencies of the band pass filters $234_1$ to $234_n$ are respectively $f_{c1}, \ldots f_{cn}$, each being offset with respect to the next by $\Delta f_m$. Consequently, if an input signal having a frequency $f_r$ is present within the input signal frequency bandwidth, the respective differential frequency on output 231 will be passed by a filter $234_p$ having center frequency $f_{cp}$, when the local oscillator frequency 215 reaches a value of $\Delta f = f_r - f_{cp}$. In practice, as the local oscillator frequency 215 varies, the output signal level of band pass filter $234_p$ increases and reaches its maximum value when $f_r - f_{cp} = \Delta f$ and then starts decreasing.

Accordingly, the input signal frequency spectrum which may be analysed by the frequency spectrum analyser constituted by synthesizer 217, mixer 214 and filter channels $232_1$ to $232_n$ has a bandwidth of $n \times \Delta f_m$. During each sweep cycle of the frequency synthesizer output 216 over its respective range $\Delta f_m$, any input signal within such spectrum will be detected by one of filter channels $232_1$ to $232_n$.

The outputs of the filtering channels may be sequentially connected by means of multiplexer 238 to analog/digital converter 242, so as to convert the respective analog level sample value at the channel output into a corresponding digital value. The values at the output 243 of A/D converter 242 are supplied via a line 244 to command unit 245 and to a gate 304 in processing unit 248, as will be explained hereinafter.

The switching rate of multiplexer 238 is so selected that during the duration of the increasing then decreasing signal level at the output of any filter channel $232_p$ corresponding to an input frequency $f_r$, several samples of the respective signal levels are sampled and digitized.

To each one of these samples levels at input $306_p$ of multiplexer 238 corresponds a respective $\Delta f_i$ value at the output of frequency synthesizer 217, which itself depends from the input 224 on programmable divider 222. The latter input value is available at the output 302 of sequencer 239. This output is coupled to an input 308 of circuit 246.

The multiplexer 238 is controlled also by sequencer 239 via line 230 which applies to its input 310 the coded address of the particular filtering channel $232_1$ to $232_n$ (input $306_1$ to $306_n$) which must be interrogated at each instant. This coded address is received on input 312 of the circuit 246 which, by an adding operation, delivers on its output 314 at each instant a digital indication of a frequency range containing the signal within the input frequency band which corresponds to the level sampled and digitized by A/D converter 242.

This frequency range on output 314 is basically equal to $f_{cp} + \Delta f_i$ where $\Delta f_i$ is the instantaneous frequency output value of frequency synthesizer 217 as represented by the digital indication on its programming input 224. It is applied to a command unit 245 as well as to gate 304 at the input of processing unit 248.

Accordingly, for each frequency programming step during one sweep cycle of the frequency synthesizer 217, a frequency range value $f_e$ may be associated to the respective level value $N_e$, both values being supplied to command unit 245 and to the gates 304 of each processing device 248.

The sequencer 239 is a conventional combination of counters which are supplied by pulses from the ultrastable oscillator 228 to provide sweep cycle control signals on its output 302 and coded control addresses for operating multiplexer 238 on line 230.

A frequency divider 700 is coupled at the output of the ultrastable oscillator 228. It performs the frequency division of the oscillator 228 by several constant factor to deliver respective accurate reference frequency signals to each processing unit 248 as will be described later.

Figure 3:
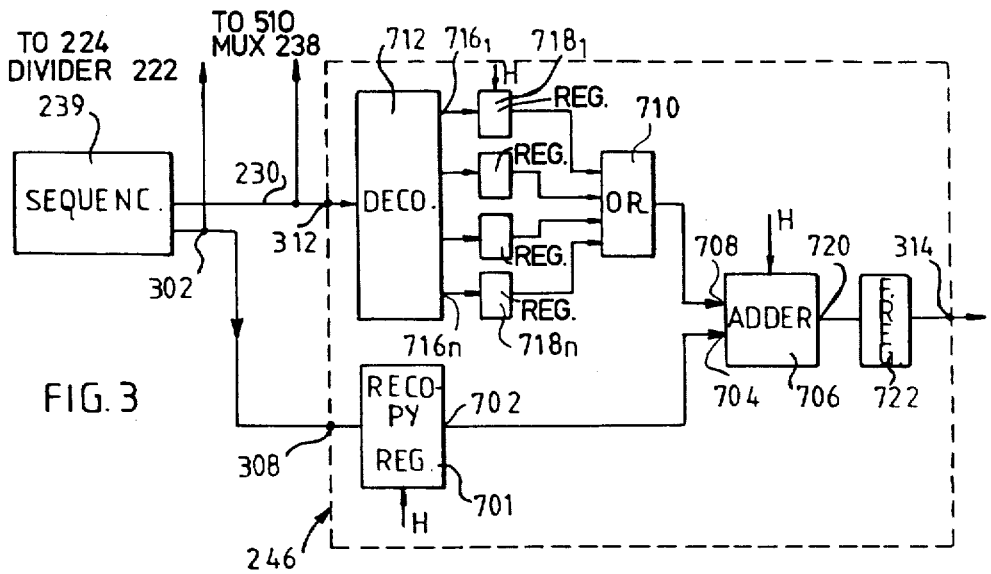
FIG. 3 is a block diagram of a frequency range indicating circuit.

FIG. 3 depicts a schematic embodiment of frequency range indication circuit 246. A recopy register 701 is connected at the multi-bit input 308 of the circuit 246 to store a digital indication of each synthesizer input programming value. Output 702 of register 701 is coupled to one input 704 of an adder 706 whose other input 708 is coupled at the output of an OR gate 710. A decoder circuit 712 is coupled to a multi-bit input 312 of circuit 246 which receives the address control signals of multiplexer 238. The decoder 712 has n outputs $716_1$ to $716_n$, each coupled to the input of the respective register $718_1$ to $718_n$. These registers are loaded with counts which correspond to the center frequencies of band pass filters $234_1$ to $234_n$. The output of each one of these registers is coupled to a respective input of OR circuit 710. Each register is controlled for readout by clock signals such as H shown for register $718_1$. Accordingly, if decoder output $716_1$, for example, is energized, the content of respective register $718_1$ will be read out of the input 708 of adder 706 via OR circuit 710 upon receipt of the H timing signal.

At the same time, the H timing signal also triggers the readout of the content of recopy register 701 to input 704 of adder 706 to deliver to an output 720 of this adder a signal which is stored in a frequency register 722 whose output forms the output 314 of circuit 246 and delivers the frequency estimate for each multiplexer 238 addressing position.

Operation of the processing unit 248 (FIG. 2) will now be described. Upon receipt of an authorization signal on line 247 from command unit 245 (which will be derived as explained hereinafter), the frequency range $f_e$ and the respective digitized level values $N_e$ are passed by gate 304 (outputs 316 and 318 respectively) to a memory 322. Also, the frequency range $f_e$ at the output of 316 of gate 304 is fed to the frequency programming input 324 of a frequency synthesizer 326 which operates to initially set the operating frequency of processing device 248 to the respective frequency range. From this value, a phase locked loop 328 operates to attempt to lock itself to a respective frequency signal present on line 249 at the input of processing unit 248. Line 249 is directly connected to input 211 (output 204 of FIG. 1).

Briefly summarized, synthesizer 326 whose input 327 receives a reference frequency from divider 700 converts the digital indication on its input 324 into an oscillating signal of respective frequency on its output 329, which is passed to a mixer which receives also the output signal of a voltage controlled oscillator 332. The differential signal at the output 334 of mixer 330 is applied to one input of a mixer 336 which receives on its second input the signals on line 249. Ouput 338 of mixer 336 is coupled to a narrow band pass filter 340 having an accurately determined center frequency to apply its resulting output signal on input 342 of a phase comparator 344 receiving on its second input 346 a reference frequency signal out of divider 700. Output 348 of mixer 344 controls via a loop filter 350 the voltage control input of VCO 332 thus completing the phase locked loop 328.

When the loop 328 is locked on a signal on input 249, a substantially DC signal on output 348 appears which corresponds to the phase modulation, if any, of the input signal and is passed to a detecting circuit 352 having one output 354 which is the data-output of the device 348 and a second output 356 which is connected via line 358 to an input 360 of command unit 245 thereby signalling that phase locked loop 328 is locked on an input signal.

As indicated before, several parallel connected processing units 248 identically arranged may be provided. The command unit 245 which is not part of this invention, is a logical circuit which may be for example operative for detecting when the digitized signals out of each filtering channels $232_1$ to $232_n$ go through a maximum level $N_{max}$. If such a signal is detected for example on input $306_p$, a respective authorization signal is sent on line 247 to each processing unit 248 whose phase lock indication on output 356, as received on input 360 of command unit 245, indicates that the respective unit is available, i.e. not locked on a particular input signal. Upon receiving such signal, gate 304 passes the respective value $N_{pmax}$ and respective frequency range $f_{pe}$ to memory 322. The frequency range is also applied for setting the frequency of synthesizer 326 to a value which is by necessity close to that of the input signals on line 249 from which such frequency range is originated in the spectrum analysis apparatus. In order to prevent identical couples $N_{pmax}$ and $f_{pe}$ to be assigned to different processing devices 248, a predetermined hierarchy is established between them in the command unit so that when one of these couples is assigned to an available processing unit, it may not be assigned to any other.

Memory 322 of each processing unit 248 has two outputs, respectively 362 and 364 for the frequency estimate and the maximum level, respectively, which are connected to outputs 366 and 368 of this processing unit via a gate 370 whose control input 372 is connected to phase lock indication line 358. Accordingly, the content of memory 322 may only be transmitted to a telemetry conditioning unit, not shown, when the respective processing unit has locked on a given input signal for processing the same.

Figure 4:
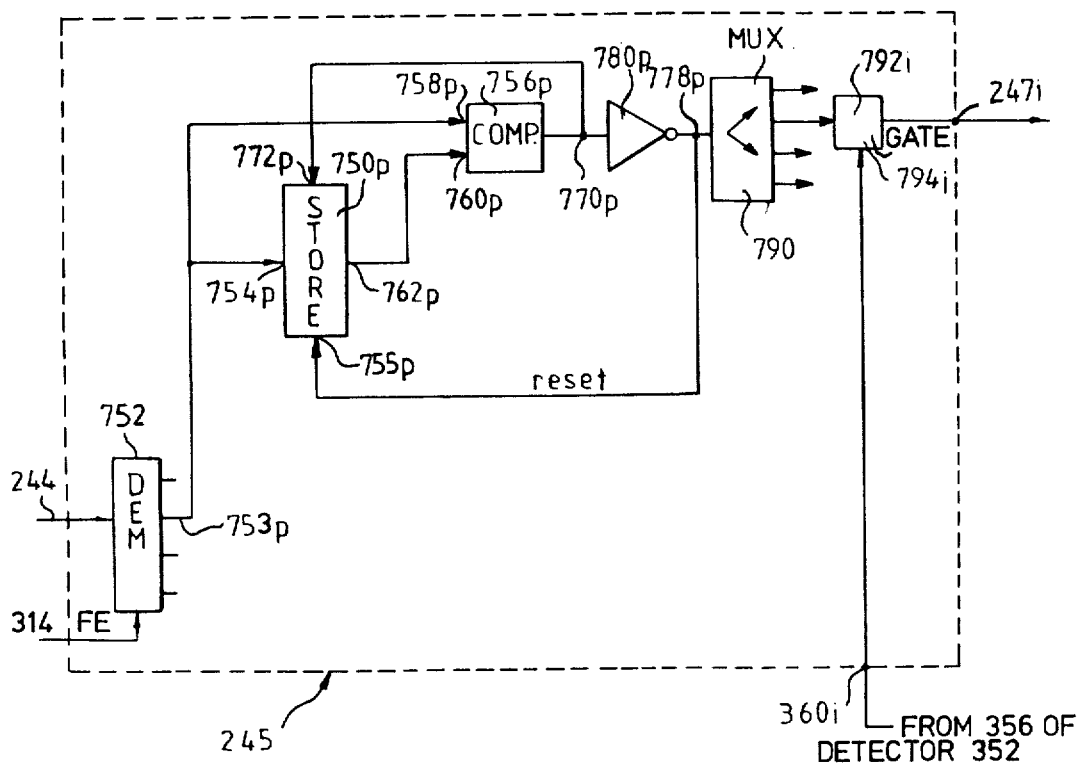
FIG. 4 is a schematic block diagram of a command unit such as represented in FIG. 2.

A simplified embodiment of a command unit 245 is depicted by FIG. 4.

Each digital level indication from a respective filtering channel $232_p$ reaching input 244 of command unit 245 is addressed by a demultiplexer 752, via respective output $754_p$ to input $754_p$ of a digital store $750_p$ and to an input $758_p$ of a digital comparator $756_p$. The other input $760_p$ of comparator $756_p$ is coupled at the output $762_p$ of store $750_p$.

For each new digital level indication, the circuit operates in two steps. First, the new level indication on output $754_p$ is compared to the content of store $750_p$ which is normally the last level indication acquired from the respective filter channel $232_p$. If the new level is greater than the stored level, a signal at the output $770_p$ of comparator $760_p$ enables input $772_p$ of store $750_p$ to store the new value on input $754_p$ in place of the previously stored value.

In the opposite situation where the last stored value was greater than the newly acquired level value, no signal is present at the output $756_p$ of comparator $760_p$. This in turn produces a signal on output $778_p$ of an inverter $780_p$ coupled to this output $770_p$, which is operative to perform two functions:

First, via a multiplexer circuit 790, it sends a control signal sequentially to each one of a plurality of gates 792, there being provided one gate $792_i$ for each processing unit $248_i$. Each gate $792_i$ is controlled by the signal on input $360_i$ indicating that the respective processing unit $248_i$ is not already phase locked (see FIG. 2, output 356 of detecting circuit 352). If gate $792_i$ is enabled by this authorization on its input $794_i$, the control signal out of multiplexer 790 is transmitted on line $247_i$ to gate $304_i$ of respective processing unit $248_i$ (see FIG. 2).

The signal at output $778_p$ is also effective to send a reset signal on reset input $755_p$ of the store $750_p$ so as to erase the previous level indication from this store.

Accordingly, the command unit 245 operates to watch the signal levels at the output of each filtering channels $232_1$ to $232_n$ and to determine the maximum of each series of levels corresponding to an input signal of respective frequency among the radio signal received. An authorization is then produced for an available processing unit $248_i$ (i.e. not locked on another input signal), to acquire the respective maximum level $N_e$ and frequency estimate $f_e$ via gate 304.

It will be recognized by the man skilled in the art that the command unit may be implemented by the use of appropriate combination of hardware circuits or by a programmed microprocessor or other programmable device to effect proper allocation of frequency estimate and respective associated level values to the processing unit.

In an example, the input frequency band to be scanned is 25 kHz. The frequency synthesizer produces a sweep signal 215 having an excursion of 25 kHz which is incremented by steps of 100 Hz.

As indicated before, each beacon signal received comprises an unmodulated portion followed by a phase modulated portion. The unmodulated or pure carrier wave portion is intended for the detection of the arrival of such message and the preparation of a respective processing unit for receiving and demodulating the following modulated portion. It will be understood that the unmodulated portion must be at least as long as the sweep cycle duration. Accordingly, the faster of the scanning speed of the input frequency spread band, the shorter the unmodulated portion of each of the beacon signals may be. Moreover, the shorter this unmodulated portion, the shorter the average overall time during which each processing unit will be busy and, consequently, the fewer processing units such as 248 have to be provided for receiving a maximum number of simultaneous signals as the satellite overflies the beacons in any one part of its revolution.

It has been found that by using such a frequency synthesizer for generating the sweep frequency a wide input frequency band may be swept quite fast while keeping accurate track of the sweep frequency value.

Specifically, if a frequency synthesizer is used to sweep a frequency band of 25 kHz instead of an other type of variable oscillator such as a VCXO having typically a 6.25 kHz frequency excursion, the number of filtering channels needed at the output of the frequency analysis mixer 214 is one, instead of four, to scan the input frequency spread band of 25 kHz. Accordingly, the amount of filtering hardware required is diminished. However, if one wishes to maintain the same overall input frequency band sweeping time for example 80 milliseconds, the frequency synthesizer sweep speed must be four times greater than that of the other type of variable oscillators such as a VCXO.

Accordingly, if the frequency synthesizer programming input sweeps 25 kHz by steps of 100 Hz in 80 milliseconds, each digital frequency indication on the programming input 224 will stay about 300 milliseconds.

When the indication on the programming input 224 switches from one value to the next, the synthesizer loop 217 operates to vary the frequency of signal on mixer input 215 to reach the new value posted on its programming input. However, this adjustment requires a time interval which is not negligible when compared to the total 300 $\mu$s time during which the programming value is posted. Typically, the time constant of the synthesizer loop 217 may be between 30 and 100 microseconds. Assuming the latter value for example, at the end of the dwell time of a given programming value on input 224, the synthesizer output signal frequency will be within 1% of the programmed value. The actual synthesizer output frequency thus varies throughout this dwell time interval, fast at the beginning thereof and increasingly more slowly thereafter.

This is an unconventional way of operating a frequency snythesizer, which is normally used for the accurate frequency positioning of the output signal which it provides, after the output frequency has stabilized.

In the instant case, by reason of the high scanning speed required, the frequency applied to the mixer 214 is variable during each 300 microseconds step and its average value is not accurately represented by the synthesizer programming input value. This lack of accuracy is referred to here as the lagging error of the synthesizer. It has been found however that, within the framework of the particular application herein contemplated, such error is acceptable for providing frequency estimates corresponding to the detected levels, in order to control a quick adaptation of each processing device to the frequency of a respective detected input signal.

In addition, it has been found that despite such lagging error, results were as good as or better than with other types of variable frequency oscillators, for example VCXO's, which are controlled by an analog signal, and this even though such oscillators operate at a lesser speed on narrower frequency excursion range.

Errors due to drift of the VCXO because of aging or other factors affecting an oscillator controlled in an open loop are eliminated. The error in determining the frequency estimate for each level value is substantially smaller than 100 Hz and as good or better than that obtained with a VCXO operating under the conditions previously described, which may typically be about ±80 Hz taking into account inevitable various sources of noise.

These results are achieved with a simple frequency analysis device including only one band pass filtering channel for a 25 KHz input signal frequency spread band. A wider band, for example a 100 KHz wide frequency band, may be scanned by using in accordance with the invention the previous frequency synthesizer (25 KHz excursion) with four band pass filtering channels $232_1$ to $232_4$ at the output of mixer 214, having staged center frequencies at 25 KHz from each other. Thus, less filtering hardware than with a conventional variable oscillator is required and errors resulting from uncertainties in the exact values of the center frequencies of the respective band pass filters are fewer, or, alternatively, for a given amount of hardware a much wider input frequency band may be scanned which sufficient speed.

In case when high frequency signals are picked up by a receiver such as 201 of FIG. 1, this receiver may comprise a frequency changer for bringing the signal applied to the input 202 to a value in the order of ten to a hundred or so kHz.

Typical radio frequencies received from the beacons may be the order of several MHz, typically 20 MHz. Thus, the receiver 201 of FIG. 1 must operate at these frequencies. The individual frequencies of the beacon signals vary typically within a band of 100 kHz about a central frequency at the MHz level indicated above. It may be advantageous for operating the processing units $209_1$ to $209_n$ (FIG. 1) to first lower this frequency by means of a frequency transposition device, not shown, and for example comprised in receiver 201. This frequency transposition device is arranged to lower the input signal frequency to produce signals at the output 204 whose frequency is down to about 100 kHz or even lower to a few tens of kHz.

Figure 5:
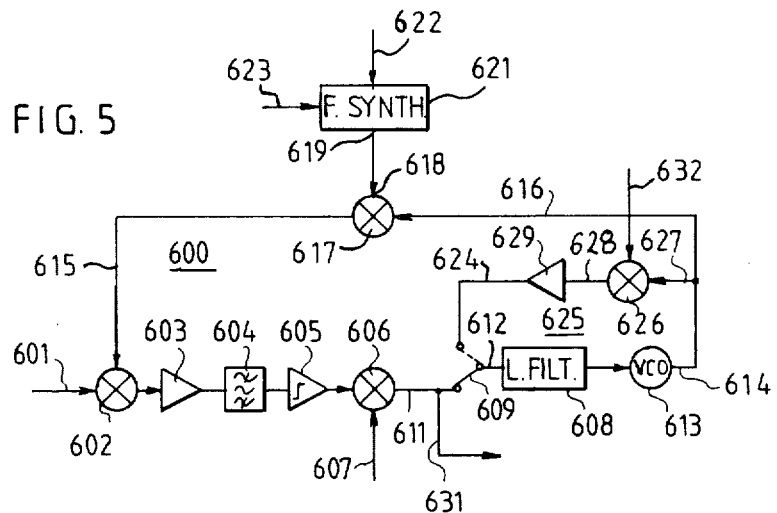
FIGS. 5 and 6 show two block diagrams for two alternative embodiments of a demodulating circuit for an apparatus such as shown in FIG. 2.

FIG. 5 represents a processing unit constructed in a manner analogous to processing unit 248 of FIG. 2 with differences which will be highlighted below for processing phase modulated input signals after downward frequency transposition thereof in receiver 201.

This processing unit of FIG. 5 comprises a phase locked loop 600 having an input 601 to a first mixer 602 which receives on its other input 615 the frequency signal out of a mixer 617.

Signals out of a receiver such as 201 are applied to the input 601. Signals out of mixer 602 are amplified in amplifier 603 whose output signals are passed through a RC type band pass filter 604 having a precisely determined center frequency and a narrow bandwidth. Output signals from filter 604 are passed through an amplitude limiter 605, then to a phase comparator 606 which is analogous to phase comparator 346 of phase locked loop 328 of FIG. 2. This comparator 606 receives reference signals from a ultrastable frequency circuit such as 700 (of FIG. 2) on its input 607 so as to deliver on its output 611 a substantially DC signal, when loop 600 is phase locked on a signal on its input 601. This DC signal output 611 may be tapped by a line 631 to transmit the phase demodulated message at the output of phase comparator 606 to a suitable telemetry apparatus not shown.

The output 611 is also connected in one position of a switch 609 to a loop filter 608 whose output controls a voltage control oscillator 613 which, contrary to circuit 332 of FIG. 2, is not a crystal controlled type VCO. In other words, this VCO 613 is a non-piezoelectric type, and its output 614 is connected to one input of mixer 617 via a line 616. The other input of mixer 617 is coupled via a line 618 to output 619 of frequency synthesizer 621 which plays a role identical with that of synthesizer 326 of FIG. 2 and receives a prepositioning frequency range signal in digital form on its input 622 from a command unit, such as 245 of FIG. 2. Also, the frequency synthesizer 621 receives a reference frequency signal 623 from a divider, such as 700 of FIG. 2, this divider being controlled by an ultrastable oscillator, such as 228 of FIG. 2.

In operation, the frequency synthesizer 621 delivers a prepositioning frequency signal to mixer 617 which produces a local oscillator frequency signal on input 615 of mixer 602. The differential frequency corresponding to the difference between this local frequency and the frequency of an input signal on input 601 closely corresponding to the frequency programmed on the synthesizer 621 is admitted through filter 604, and phase comparators 606 adjusts the control voltage of VCO 613 until the loop 600 is phase locked on the respective signal on input 601.

As the VCO 613 is not crystal controlled, it is more subject than a standard VCXO to drift for various causes including aging of the circuitry. Therefore, after each message carried by a given signal on input 601 has been fully demodulated, (this being detected by a control circuit not shown at the output of line 631), the VCO 613 is reset to a predetermined frequency before a new frequency range is applied to frequency synthesizer 621. To this end, switch 609 may connect the input 612 of loop filter 608 to a line 624 at the output of an amplifier 629. This amplifier amplifies an analog DC voltage at the output 628 of a phase comparator 626 which has one input 632 coupled to a reference circuit such as 700 of FIG. 2 for providing a reference frequency control signal thereon and its other input 627 coupled to the output 614 of VCO 613. Thus, when switch 609 is on the position shown in dotted-line on FIG. 5, a new phase locked loop 625 is established which tends to reset the output frequency of VCO 613 to the reference frequency on input 632. This input frequency is determined on the basis of the frequency of an ultrastable oscillator such as 228 of FIG. 2.

Accordingly, a circuit is provided for demodulating signals at the output of a receiving circuit which have been lowered in frequency and whose frequencies are spread in a bandwidth which is limited to a few tens of kHz.

In the case of the loop 328 of processing unit 248 of FIG. 2 which operates on very high input frequencies crystal components must be used to insure a sufficient stability of the voltage controlled oscillator 332 and of the used filters.

In the case of FIG. 5, advantage is taken from the fact that the range within which the unknown input radio frequency picked up by receiver 201 lies is relatively narrow, with respect to the absolute value of such radio frequency. In most cases, such range of uncertainty about the unknown frequency is comprised between a few kHz and 100 kHz. It is thus possible to lower the signal input frequency in receiver 201 to a working frequency which is of the order of magnitude of the width of the frequency bandwidth of the input radio frequency signals.

At such low frequencies a good absolute frequency stability of the components used may be achieved to provide an accurate demodulation with filters comprising only RC components, i.e. without quartz, and by using a non-piezoelectric VCO with a resetting loop as described.

After the VCO 613 output frequency has been reset and a new frequency range signal has been applied to the programming input 622 of frequency synthesizer 621, the switch 609 may be brought back to its position shown in plain line, so that the loop 600 operates to attempt to lock itself on a new signal on input 601 whose frequency corresponds to a respective frequency range applied on synthesizer input 622.

The periodical resetting of VCO 613 eliminates lack of component stability which may be brought about by various environmental factors.

Figure 6:
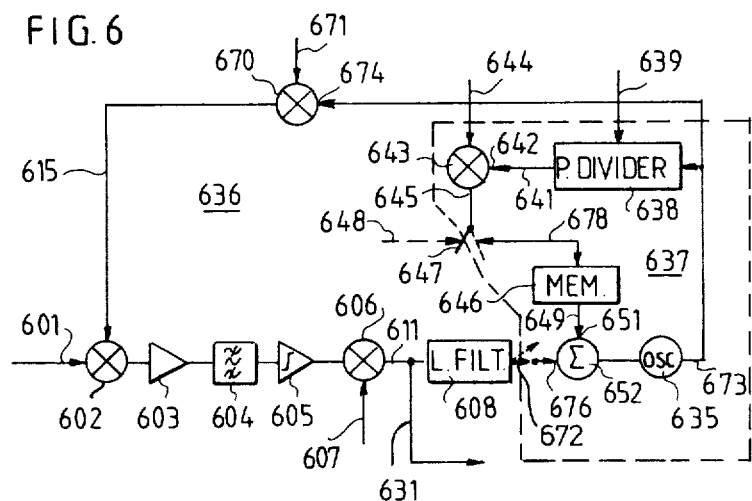

Another embodiment may be used, according to FIG. 6, wherein a single voltage controlled oscillator is used both for the frequency synthesizer which helps in prepositioning the demodulating phase locked loop to an frequency range and for the demodulating loop itself.

In the embodiment of FIG. 6, the same reference numbers have been kept for elements which are identical with those of FIG. 5. Basically, input mixer 602, amplifier 603, filter 604, limiter 605, mixer 606, loop filter 608 are all part of a demodulating phase locked loop 636 wherein a VCO 635 is connected at the output of the loop filter 608 via a switch 672 and a summing circuit 652. The output 673 of VCO 635 is coupled to one input 674 of a mixer 670 receiving on its other input 671 a reference signal from an ultrastable circuit such as 700. The output of mixer 670 is coupled via line 615 to input mixer 602 so that loop 636 operates to demodulate signals appearing on line 601 when switch 672 is shown in its plain line position. In this position voltage summing circuit 652 provides a voltage control signal to VCO 635 which is the sum of the output of loop filter 608 and of a prepositioning signal on its input 651 coupled to the output 649 of a memory circuit 646.

The output of oscillator 635 is also coupled to the input of a programmable divider 638 which receives on its programming input 639 a digital frequency range indication from a command unit, such as for example unit 245 of FIG. 2. The divided signal out of divider 638 is applied to one input 642 of a phase comparator 643 receiving an ultrastable reference frequency signal on its other input 644. Output 645 of phase comparator 643 is connected via a switch 647 to the input 678 of memory 646.

When switch 672 is in the plain line position shown on FIG. 6, switch 647 is also on a plain line position shown thereby opening the loop 637 formed by VCO 635, programmable divider 638, phase comparator 643 and memory 646 while the phase locked loop 636 is closed and operating.

When switches 672 and 647 are switched into their dashed line positions of FIG. 6 by a control device not shown, at the end of the demodulation of a message carried by a signal on input 601, the loop 637 is then closed and loop 636 is open. A programming frequency range indication on input 639 of frequency divider 638 is then operative for resetting, via memory 646 and summing circuit 652 the oscillator 635 output frequency. Thus, loop 637 plays the role of frequency synthesizer 621 of FIG. 5 and that of the resetting loop 625 of the same Figure. When the switches 647 and 672 are brought back to their plain-line position, the analog signal from memory 646 acts to keep the operating loop 636 prepositioned on a frequency value corresponding to the allocated frequency range until the loop 636 starts operating on signals on its input 601.

One advantage of the circuit of FIG. 6 over that of FIG. 5 is a simplification since only one voltage controlled oscillator has to be used instead of two. This tends not only to simplify the circuit but also to improve the performances in respect of phase jitter, the loop 636 being subjected to the jitter of only one VCO instead of two. The demodulating loop 636 is less subject to noise from the frequency synthesizer than is loop 600 in FIG. 5.

In both FIGS. 5 and 6, long term drifts of the VCO are compensated.

In the case of FIG. 6, the additional mixer 670 helps in lowering the operating frequency of the loop 636.

In the embodiments reviewed with reference to FIGS. 5 and 6, the input frequency of the input signals has been lowered to an order of magnitude which is about that of the overall bandwidth within which the unknown frequencies of the signals to be acquired are spread.

If such input frequency bandwidth is rather large such as over 100 kHz or more, instead of, or in addition to lowering simultaneously the frequency of all the input signals by a common frequency changing circuit, each processing unit may be provided with an input frequency changer which is adjustable in response to the frequency range which is allocated to that processing unit to reduce the frequency bandwidth of a signal admitted to this processing unit.

Figure 7:
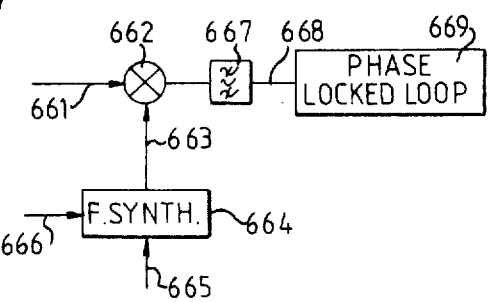
FIG. 7 is a block diagram of an input section for a circuit such as shown in FIGS. 5 and 6.

FIG. 7 depicts very schematically such a system wherein a demodulating phase locked loop 669, constructed for example as shown in FIGS. 5 and 6 receives on its input 668 signals out of a band pass filter 667 having a frequency bandwidth of 6 kHz for example. This filter receives the output signal of a mixer 662 having one input 661 coupled to the output of the radio signal receivers such as 201 of FIG. 1 and another input 663 connected to the output of a frequency synthesizer 664 whose programming input 665 is adjusted by a selected number of the most significant digits of the frequency range indication used for prepositioning phase locked loop 669. Frequency synthesizer 664 also receives a reference frequency signal on its input 666 from a reference unit such as 700, so as to deliver a signal at the output of mixer 662 which may correspond to any signal received within a frequency band of 6 kHz on either side of the frequency range approximation allocated to input 665. Accordingly, difficulties arising out of the wide frequency bandwidth of the input signals are alleviated as far as the processing units are concerned by preselecting the frequency bandwidth of the input signals admitted to each of said processing unit, in accordance with the frequency analysis performed and the allocation of frequency estimates to these processing units.

We claim:

1. An apparatus for receiving messages transmitted from a plurality of radio signal sources operating at different frequencies within a predetermined frequency band comprising:

means for receiving said radio signals lying within said radio frequency band;

means for frequency scanning the signal provided by said means for receiving for determining frequency information identifying a frequency range for each of said signals;

a demodulating phase locked loop connected to receive said signals from said means for receiving, including a voltage controlled oscillator, an input mixer having one input to receive said radio signals and another input to receive a signal from said voltage controlled oscillator, a phase comparator for comparing an output signal of said mixer with a reference signal and supplying an error signal to said voltage controlled oscillator, said error signal representing phase modulation included on one of said radio frequency signals;

means coupled to said voltage controlled oscillator for establishing an initial operating frequency of said voltage controlled oscillator of said demodulating phase locked loop in response to said frequency information determined by said means for frequency scanning; and means coupled to the voltage controlled oscillator for resetting the output signal frequency of said voltage controlled oscillator to a value independent of the frequency of said radio signals.

2. The apparatus of claim 1, wherein said phase locked loop further comprises a narrow band pass filter connected between said mixer and said phase comparator.

3. The apparatus of claim 1, wherein said frequency information is a digital signal.

4. The apparatus of any of claims 1 or 2, wherein said means for establishing an initial operating frequency comprises a frequency synthesizer having a programming input controlled in response to respective frequency information from said means for frequency scanning and means for combining said voltage controlled oscillator output signal and said frequency synthesizer output signal to provide a signal for said another input of said input mixer.

5. The apparatus of claim 1, wherein said resetting means comprises means for phase comparing the voltage controlled oscillator output signal with a reference signal, and switch means for selectively breaking said phase locked loop and connecting the output of said phase comparing means to the input of said voltage controlled oscillator in the resetting condition.

6. The apparatus of claim 1, wherein said establishing an means initial operation frequency comprises:

memory means coupled to produce a voltage controlled oscillator control signal which corresponds to a prescribed output signal frequency value of said voltage controller oscillator in the absence of any signal on the output of said receiver means;

and said resetting means comprises means for phase comparing said voltage controlled oscillator output signal frequency with a prescribed frequency information from said means for frequency scanning; and switch means for selectively connecting said phase comparing means to said memory means and disconnecting said voltage controlled oscillator control input from said phase locked loop in a resetting condition.

7. The apparatus of claim 6, wherein said frequency information is digital and said memory means output signal is analog.

8. The apparatus of claim 6, wherein said phase comparing means comprises a programmable divider responsive to said voltage controlled oscillator output signal frequency and having a digital input for receiving said frequency information and a phase comparator for comparing the output of said programmable divider with a fixed reference frequency signal.

9. The apparatus of claim 6, further comprising means for summing the output signal of said memory means and the output of said phase comparing means in said demodulating phase locked loop to control the input of said voltage controlled oscillator.

10. The apparatus of claim 1, further including means for lowering the frequency of the received radio signals before they are applied to said demodulating phase locked loop to a value which is within the input frequency band of the demodulating phase locked loop.

11. The apparatus of claim 1, comprising a plurality of demodulating phase locked loops and means responsive to said means for frequency scanning for allocating respective frequency information to each of said demodulating phase lock loops.

12. The apparatus of claim 11, further comprising means connected between said receiving means and each of said demodulating phase locked loops for lowering the center frequency of signals which are to be admitted to respective ones of said demodulating phase lock loops from said receiving means.

13. The apparatus of claim 11, further comprising means at the input of each of said demodulating phase locked loops, for admitting receiving means output signals to at least a respective one of said demodulating phase locked loops only within a frequency bandwidth selected in response to a respective frequency information out of said means for frequency scanning.

14. The apparatus of claim 13, wherein said frequency information comprises the most significant bits of a digital indication of the frequency range allocated to the means for establishing an initial operating frequency in the respective means.

15. The apparatus of claim 1 wherein said frequency scanning means comprises:

a mixer for receiving said radio signals and a local oscillator signal;

a plurality of bandpass filters connected to receive a heterodyned signal from said mixer;

a multiplexer for individually sampling each of said band pass filters output signals in response to a control signal;

a frequency synthesizer for generating a sequence of frequency stepped local oscillator signals;

timing generator means connected to provide first and second synchronized control signals to said multiplexer, and said frequency synthesizer whereby said local oscillator signals are produced in a stepped frequency sequence and said band pass filters are sampled in synchronization with said stepped frequency sequence; and a frequency range determining means connected to receive said control signals and said multiplexer sampled output signal, said range determining means providing a digital signal representing a frequency range of a band pass filter receiving a heterodyned signal from said mixer.

* * * * *